United States Patent
Gerard et al.

(10) Patent No.: US 8,841,542 B2
(45) Date of Patent: *Sep. 23, 2014

(54) PHOTOVOLTAIC MODULE

(75) Inventors: Pierre Gerard, Denguin (FR); Stephane Bizet, Barc (FR); Dominique Jousset, Serquigny (FR)

(73) Assignee: Arkema France, Colombes (FR)

( * ) Notice: Subject to any disclaimer, the term of this patent is extended or adjusted under 35 U.S.C. 154(b) by 284 days.

This patent is subject to a terminal disclaimer.

(21) Appl. No.: 13/500,648

(22) PCT Filed: Oct. 7, 2010

(86) PCT No.: PCT/FR2010/052113
§ 371 (c)(1),
(2), (4) Date: Jun. 28, 2012

(87) PCT Pub. No.: WO2011/042665
PCT Pub. Date: Apr. 14, 2011

(65) Prior Publication Data
US 2012/0260975 A1 Oct. 18, 2012

(30) Foreign Application Priority Data
Oct. 8, 2009 (FR) .................................. 09 57006

(51) Int. Cl.
*H01L 31/048* (2014.01)
*C08F 293/00* (2006.01)
*C08L 53/00* (2006.01)
*B32B 17/10* (2006.01)

(52) U.S. Cl.
CPC ................. *C08L 53/00* (2013.01); *Y02E 10/50* (2013.01); *H01L 31/048* (2013.01); *B32B 17/10743* (2013.01); *C08F 293/005* (2013.01)
USPC ........... 136/251; 136/252; 136/259; 525/242; 525/299; 257/433; 438/64

(58) Field of Classification Search
CPC ........... C08F 293/00–293/005; C08F 297/026; C09D 153/00; C09J 153/00; C08L 53/00; B32B 17/10743; H01L 31/048–31/0481
USPC ............. 136/251, 252, 259; 257/433; 438/64; 525/242, 298, 299
See application file for complete search history.

(56) References Cited

U.S. PATENT DOCUMENTS

| 4,262,161 A | 4/1981 | Carey |
| 8,618,624 B2 * | 12/2013 | Gerard et al. ................. 257/433 |
| 2006/0063891 A1 | 3/2006 | Ruzette et al. |
| 2010/0184926 A1 | 7/2010 | Gerard et al. |
| 2010/0190930 A1 | 7/2010 | Bourrigaud et al. |

FOREIGN PATENT DOCUMENTS

| EP | 0 921 170 A1 | 6/1999 |
| FR | 2 912 967 A1 | 8/2008 |
| FR | 2 921 068 A1 | 3/2009 |
| WO | WO 03/062293 A1 | 7/2003 |
| WO | WO 2011138630 A1 * | 11/2011 |

OTHER PUBLICATIONS

International Search Report of PCT/FR2010/052113 (Dec. 17, 2010).

* cited by examiner

*Primary Examiner* — Irina S Zemel
*Assistant Examiner* — Jeffrey Lenihan
(74) *Attorney, Agent, or Firm* — Millen, White, Zelano & Branigan, P.C.

(57) ABSTRACT

The present invention relates to a photovoltaic module comprising as an encapsulant a composition comprising at least one polyacrylate- or polymethacrylate-type block copolymer with the general formula B-(A)n, n being a natural integer no lower than one, preferably 1 to 8, the block A being selected from among methacrylates having a Tg higher than 0° C., the block B being a polyacrylate or a polymethacrylate having a Tg lower than 0° C., the block B being at least 50 wt % of the total weight of the block copolymer.

19 Claims, No Drawings

PHOTOVOLTAIC MODULE

The present invention relates to compositions based on acrylic block copolymers used in the encapsulation of photovoltaic cells which go to make up solar modules.

Solar modules are arousing increasing interest, owing to the renewable non-polluting nature of the resulting energy. A solar module comprises a photovoltaic cell consisting of optoelectronic components (usually based on crystalline silicon), which generates an electric voltage when exposed to light. Photovoltaic cells are placed between a transparent covering material, which is a glass or plastic plate, and a protective material behind, often a plastic film. In the manufacture of a solar module, the objective of encapsulation is to group the cells together in series or in parallel in order to allow them to be used at practical tensions and currents while at the same time ensuring that they are electrically insulated and protected against external factors (moisture, oxygen, temperature variations). Furthermore, in order not to decrease the yield of the solar module, the encapsulant must allow transmittance of the light waves from the solar radiation to the cells. Still in order not to decrease the yield, it is desirable for these waves to be barely diffracted, i.e. for the encapsulant to be transparent to the naked eye, the transparency being quantified by its "Haze", which must be low, or its luminous transmittance, which must be as high as possible. It is also necessary for the encapsulant to have good electrical insulation properties, in order to avoid any short-circuiting inside the module. The encapsulation material must therefore offer optimal and long-lasting transparency to solar radiation and good adhesion of the various layers inside the photovoltaic cell, throughout the life of the solar module, which must be greater than or equal to 20 years.

The use in solar modules of an encapsulant based on an ethylene-vinyl acetate (EVA) copolymer, described for example in document JP19870174967, constitutes the most widespread solution at the current time. EVA has good transparency. However, its adhesion with the protective layers is not satisfactory and adhesion aids, commonly referred to as "coupling agents", generally chosen from organic titanates or silanes, must therefore be added. In addition, EVA degrades under the influence of solar radiation and of temperature; a release of acetic acid which corrodes the photovoltaic cells is then observed. Moreover, aging of the encapsulant over time is also noted, which is reflected in particular by considerable yellowing, resulting in a decrease in the solar module yield. In addition, the creep resistance of EVA is not sufficient under the conditions in which solar modules are used. It is therefore necessary for this copolymer to be crosslinked; it is therefore no longer thermoplastic. The modules are then more difficult to recycle after this step of crosslinking the encapsulant. Moreover, this crosslinking step constitutes an additional step in the solar module manufacturing process, which therefore leads to a loss of productivity.

In order to avoid a crosslinking step and in order to solve the thermomechanical properties of the encapsulant, in particular the creep resistance problems, the use of an ionomer as an encapsulant in solar modules has been envisioned in document WO95/22843. This ionomer is a noncrosslinked thermoplastic copolymer of ethylene and of (meth)acrylic acid which is partially neutralized with cations of elements of group I, II or III of the Periodic Table (for example zinc or calcium cation). The adhesion of this encapsulant with the photovoltaic cell and the protective layers is correct. These ionomers also have good transparency to the naked eye. However, although the thermomechanical properties are better than those of noncrosslinked EVA, the creep resistance is not sufficient. Indeed, the formation of an ionic network allows the ionomer to retain a certain cohesion beyond its melting temperature, but without its creep resistance being entirely satisfactory. Another major problem of the ionomer is its high viscosity at the customary temperatures for manufacturing solar modules (generally included in the range of from 120° C. to 160° C.). As it happens, this high viscosity inhibits productivity: this is because, in a continuous film manufacturing process, for example a manufacturing process by extrusion, the flow rate of film at the extruder outlet decreases when the viscosity increases.

Likewise, in documents U.S. Pat. No. 4,692,557 and WO 2006/093936 and for the same reasons as those mentioned above, it has been envisioned to use, as encapsulant, vinyl and diene block copolymers of SEBS type where S represents a polystyrene thermoplastic block and EB represents a partially hydrogenated butadiene elastomer block (for example the Kraton G® range from the company Kraton). However, the durability of such materials, even with antioxidants, UV absorbers and stabilizers added thereto, is not sufficient to ensure integrity of the solar module over 20 years. Accelerated aging (more than 10 000 h) or natural aging (more than 10 years) of such a material will lead to discoloration, embrittlement and also a loss of optical properties of the layer of encapsulant.

In document U.S. Pat. No. 6,414,236, the encapsulant is an olefin block copolymer (for example, the Engage® or Affinity® range from the company Dow Chemical). This encapsulant is intended to improve the resistance to aging of the solar module. However, its creep resistance remains mediocre and crosslinking thereof is therefore necessary: the encapsulant is therefore no longer thermoplastic, which affects its optical properties and in particular its luminous transmittance.

All or some of the drawbacks and problems presented above apply not only to any type of solar module, but also to any other type of photovoltaic cell and integrated circuit using silicon as a semiconductor.

There is therefore a need to develop new encapsulating materials which overcome the drawbacks presented by the known encapsulation materials.

The present invention proposes to provide a composition of acrylic or methacrylic block copolymers which has very good properties of transparency, adhesion and resistance to aging under ultraviolet (UV) radiation and which does not necessarily require crosslinking, these properties recommending it quite particularly for the encapsulation of photovoltaic cells.

To this effect, the subject of the invention is a photovoltaic module comprising, as an encapsulant, a composition comprising at least one polyacrylate- or polymethacrylate-type block copolymer which corresponds to the general formula B-(A)n, n being a natural integer greater than or equal to one, preferably between 1 and 8, block A being chosen from methacrylates having a Tg above 0° C., block B being a polyacrylate or a polymethacrylate having a Tg below 0° C., block B representing at least 50% by weight of the total weight of the block copolymer.

Preferably, said block copolymer contains a poly(butyl acrylate) block and at least one poly(methyl methacrylate) block.

Surprisingly, this composition combines excellent properties of transparency, resistance to aging under ultraviolet radiation and of electrical insulation, water- and oxygen-barrier properties, and properties of elasticity and of adhesive power, at working temperatures of about 70° C. or more, these properties allowing its advantageous use in solar modules.

Well known to those skilled in the art, said composition is nanostructured. Reference may be made to the article "Block Copolymers in Tomorrow's plastics", A. V. Ruzette and L. Leibler, Nature Materials, vol. 4, January 2005, pp 19-31. According to the invention, the term "nanostructured composition" is intended to mean a composition comprising at least two immiscible phases, in which one (or more) of the dimensions of at least one of these phases is less than 780 nm. Advantageously, this dimension is less than 380 nm, for example in the range of from 60 to 380 nm and better still from 60 to 300 nm. The phase dimensions can be easily measured by those skilled in the art with the known technique of transmission electron microscopy and standard image-processing software.

Since the composition is nanostructured, a composition is obtained which transmits visible light and/or is transparent to visible light according to the definition of the invention, which is adhesive and which has very good creep resistance at temperatures that can reach 70° C., or higher. Combined with its water-barrier and gas-barrier properties and its electrical properties, this thermoplastic composition can be very advantageous when used as an encapsulant in the solar module field, without it being obligatory to perform crosslinking of the composition.

In the photovoltaic module according to the invention, the composition described above is used as an encapsulant. This composition is applied to a support, formed by the upper or lower layer of protection or else by the photovoltaic cell. This support may consist of glass, polymer and in particular PMMA, metal or any type of photovoltaic sensor. The structure formed by said composition applied to a support has a thickness of between 5 μm and 2 mm.

DETAILED DESCRIPTION OF THE INVENTION

The present invention provides a photovoltaic module comprising an acrylic material which both has very good transparency properties that remain constant over time and over a wide temperature range (ranging from ambient temperature up to 80° C.) and keeps good electrical insulation properties, water- and oxygen-barrier properties, elasticity properties and adhesive power properties. Said material is in the form of a composition containing at least one polyacrylate or polymethacrylate block copolymer. This composition is advantageously used as an encapsulant in solar modules.

The block copolymers constituting the composition correspond to the general formula B-(A)n, in which:
  n is a natural integer greater than or equal to one, preferably between 1 and 8,
  B represents a block of polymer consisting of the linking of radical-polymerizable monomer units, the overall Tg of which is below 0° C. The average molar mass of block B is greater than 1000 g/mol, preferably greater than 5000 g/mol and even more preferentially greater than 10 000 g/mol,
  A is a block of polymer consisting of the linking of radical-polymerizable monomer units, the overall Tg of which is above 0° C.

The relative lengths of blocks A and B are chosen such that the ratio:

$$\frac{n \times Mn(B)}{n \times Mn(A) + Mn(B)}$$

is between 0.5 and 0.95, preferably between 0.6 and 0.8.

Mn in this case denotes the number-average mass of the polymer; the symbol "×" is used to denote a multiplication operation.

The block copolymer has a polydispersity index PI of between 1.1 and 3, advantageously between 1.3 and 2.5 and preferably between 1.5 and 2. Block B has an a PI of less than 1.5.

Block B represents more than 50% by weight of the total weight of the block copolymer, and preferably between greater than 50% and 70%.

B is a polymer block obtained by polymerization of a mixture of monomers ($B_0$) containing at least 60% by weight of acrylic monomers ($b_1$).

The mixture of $B_0$ monomers comprises from 60 to 100% by weight of at least one acrylic monomer ($b_1$) chosen from alkyl acrylates having an alkyl chain containing at least two carbon atoms and preferably at least four carbon atoms, such as butyl acrylate, octyl acrylate, nonyl acrylate, 2-ethylhexyl acrylate, polyethylene glycol acrylate or acrylonitrile. The other monomers, ($b_2$), which go to make up block B are chosen from radical-polymerizable monomers such as ethylene monomers, vinyl monomers and the like.

In particular, B is a polyacrylate or a polymethacrylate having a Tg below 0° C. Preferably, B contains butyl acrylate units. Tg denotes the glass transition temperature of a polymer, measured by DSC (differential scanning calorimetry) according to standard ASTM E1356, for example with temperature increase ramps at 20° C. per minute.

Block A is obtained by polymerization of a mixture of monomers $A_0$ comprising:
  from 60 to 100% by weight of at least one methacrylic monomer (a1) chosen from alkyl methacrylates, such as methyl, butyl, octyl, nonyl or 2-(ethylhexyl)methacrylates, or else functional methacrylates, such as methacrylic acid, glycidyl methacrylate, methacrylonitrile or any methacrylate comprising an alcohol, amide or amine function, and
  from 0 to 40% by weight of at least one monomer ($a_2$) chosen from anhydrides such as maleic anhydride or vinylaromatic monomers such as styrene or its derivatives, in particular alpha-methylstyrene and the monomers corresponding to b1.

In addition, a proportion of the monomers being used for block B will optionally be kept in the mixture. Said proportion is at most equal to 20% of the mixture of monomers being used for block A.

Block A is preferably chosen from methacrylates having a Tg above 0° C. Preferably, A contains methyl methacrylate units.

The block copolymers which go to make up the composition according to the invention are prepared in a known manner by controlled radical polymerization, from at least one monofunctional alkoxyamine of formula (I) below:

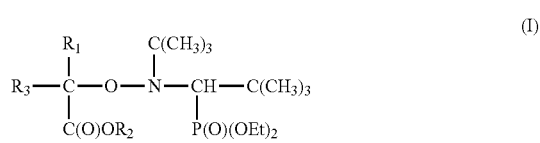

in which:
  $R_1$ and $R_3$, which may be identical or different, represent a linear or branched alkyl group having a number of carbon atoms ranging from 1 to 3;
  $R_2$ representing a hydrogen atom, a linear or branched alkyl group having a number of carbon atoms ranging from 1 to 8, a phenyl group, an alkali metal such as Li, Na or K, an ammonium ion such as $NH_4^+$, $NHBu_3^+$; preferably, $R_1$ being $CH_3$ and $R_2$ being H; and/or at least one polyfunctional alkoxyamine of formula (III):

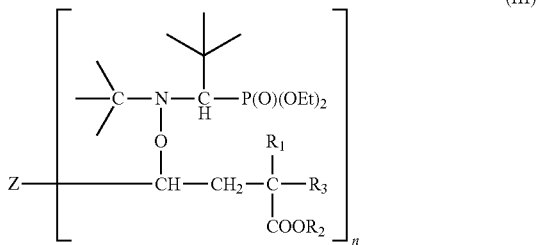

in which:

$R_1$, $R_2$ and $R_3$ are as defined above;

Z represents an aryl group or a group of formula $Z_1$—[X—C(O)]$_n$, in which $Z_1$ represents a polyfunctional structure originating, for example, from a compound of the polyol type, X is an oxygen atom, a nitrogen atom bearing a carbonaceous group or bearing a hydrogen atom; or a sulfur atom; and n is an integer greater than or equal to 2.

The polymerization is carried out at temperatures ranging from 60 to 250° C., preferentially from 90 to 160° C., and at pressures ranging from 0.1 bar to 80 bar, preferably from 0.5 bar to 10 bar. The polymerization must be controlled, and it is stopped before 99% conversion, preferably before 90% conversion of the monomer(s). Block B thus obtained is either used with the residual of monomers, or purified from the monomers by distillation or washing and drying with a solvent that is immiscible with B and miscible with the monomers used. The conversion by weight of the monomer ranges from 10 to 100% and the block copolymer obtained is separated from the residual monomers by evaporation under vacuum at temperatures ranging up to 250° C. and preferentially up to 250° C.

According to one embodiment, the block copolymer which goes to make up the composition according to the invention is copolymerized with a methacrylate or acrylate monomer, in order to improve the adhesive power of the composition. Advantageously, the block copolymer contains up to 10 mol % of these monomers, for example from 0.01 to 5 mol % and preferentially from 0.1 to 1%. In one embodiment variant, said monomer contains silane functions.

Preferably, the composition comprises a methacrylate monomer containing acid, anhydride or imidazolidone functions, acting as adhesion promoter. Advantageously, the block copolymer contains up to 50 mol % of these monomers, for example from 0.1 to 20 mol % and preferentially from 1 to 10%. As an example, reference may be made to the Norsocryl® range from the company Arkema and in particular the mixture containing 50% by weight of methyl methacrylate and 50% by weight of 2-(2-oxoimidazolidinyl)ethyl methacrylate, referenced under the trade name Norsocryl 104®.

Adantageously, the flow temperature of the block copolymer is the glass transition temperature of the polymethacrylate block(s), measured by thermomechanical analysis according to standard ISO 11359-2. According to the invention, the flow temperature of the block copolymer is included in the range of from 80 to 150° C. In this flow temperature range, the composition has good creep resistance at the temperatures at which the solar modules are used. When it is used for the manufacture of structures such as solar modules, the temperature ranges for manufacturing these structures are identical to those normally used.

The composition which serves as encapsulant must marry up perfectly with the shape of the space that exists between the photovoltaic cell and the protective layers in order to avoid the presence of air, during the manufacture of the solar module and during its use, which would limit the yield thereof. The encapsulant must thus have a very high flexibility, corresponding to a tensile elastic modulus (or Young's modulus) of less than 1000 MPa, for example from 1 to 700 MPa and preferably between 10 and 500 MPa.

The composition may also comprise a tackifying resin, a plasticizer or another polymer, termed supplementary polymer. Preferably, this supplementary polymer is miscible or partially miscible with the block copolymer. This supplementary polymer represents less than 50% by weight of the total mass of the composition and preferentially less than 20% of the composition. Its use reduces the price of the composition. When this supplementary polymer is miscible or partially miscible, the composition then exhibits an excellent cost/transmittance of the visible light and/or transparency to visible light balance. Preferably, this supplementary polymer is poly(methyl methacrylate) (PMMA).

The composition advantageously comprises at least 50%, preferentially at least 65% and even more preferably at least 75% by mass of acrylic block copolymers.

The composition may also comprise at least one of the additional components chosen from crosslinking agents, UV absorbents, inorganic fillers, plasticizers, flame-retardant additives, coloring compounds or brightening compounds. When the composition is used as an encapsulant in a solar module, the nature and/or the concentration of these components must be such that the final composition remains transparent and/or transmits visible light. By way of example, these compounds can represent from 0 to 20% by weight of the total mass of the composition, for example from 0.01 to 10%.

Characteristically, the composition of the invention transmits visible light and/or is transparent to visible light. According to the invention, the composition transmits visible light when it exhibits a transmittance greater than or equal to 90%; the composition is transparent to visible light when it has a haze less than or equal to 5%. The transmittance and the haze of the composition are evaluated according to standard ASTM D 1003, on a film of said composition which is 400 µm thick and for at least one wavelength in the visible range (from 380 to 780 nm).

The composition would also be in accordance with the invention if it comprised a mixture of acrylic block copolymers as defined previously.

Among the list of additives hereinafter, those skilled in the art will be able to easily select the amounts thereof in order to obtain the desired properties of the composition.

Coupling agents can be advantageously added in order to improve the adhesive power of the composition when said adhesive power must be particularly high. According to the invention, the coupling agent is a nonpolymeric ingredient; it may be organic, crystalline and more preferentially semicrystalline semiorganic. Among said agents, mention may be made of organic titanates or silanes, for instance monoalkyl titanates, trichlorosilanes and trialkoxysilanes. Advantageously, the composition comprises from 0 to 20%, of the total mass of the composition, of coupling agents, for example from 0.01 to 10% by mass and preferentially from 0.1 to 5%.

Although crosslinking is not obligatory, it is possible in order to further improve the thermomechanical properties of the encapsulant, in particular when the temperature becomes very high. It is not therefore a departure from the context of the invention if crosslinking agents are added. As examples, mention may be made of organic peroxides or isocyanates. This crosslinking may also be carried out by known irradiation techniques.

Since UV radiation causes yellowing of the encapsulant, UV stabilizers can be added in order to ensure transparency of the encapsulant during its lifetime. These compounds may, for example, be benzophenone-based or benzotriazole-based. They can be added in amounts of less than 10% by mass of the total mass of the composition and preferentially from 0.1 to 5%.

Fillers, in particular inorganic fillers, can be added in order to improve the thermomechanical strength of the composition. In a nonlimiting manner, silica, alumina or calcium carbonates or carbon nanotubes will be given as examples. Advantageously, modified or non-modified clays, which are mixed on a nanoscale, are used; this makes it possible to obtain a more transparent composition.

Plasticizers may be added in order to facilitate the implementation and improve the productivity of the process for manufacturing the composition and the structures. As examples, mention will be made of paraffinic, aromatic or naphthalenic mineral oils which also make it possible to improve the adhesive power of the composition according to the invention. Mention may also be made, as plasticizers, of phthalates, azelates, adipates, and tricresyl phosphate.

Flame-retardants may also be added.

Coloring or brightening compounds may also be added.

In the photovoltaic module according to the invention, the composition described above may be advantageously used as an encapsulant. This composition is applied to a support, formed by the upper or lower layer of protection or else by the photovoltaic cell. This support may consist of glass, polymer and in particular PMMA, metal or any type of photovoltaic sensor. The structure formed by said composition applied to a support has a thickness of between 5 μm and 2 mm.

Preferentially, the structure has a thickness of between 5 μm and 2 mm, preferentially between 100 μm and 1 mm and even more preferentially between 300 and 500 μm. These structures may in particular take the form of a film. These films may be advantageously used for the encapsulation of solar cells. These structures may be monolayer or multilayer. For the latter, a support may, for example, be associated with the layer of the composition according to the invention, it being possible for this support to comprise polymers. As an example of polymers, mention may be made of polyolefins, for instance EVA, these polyolefins optionally comprising an unsaturated monomer, ionomers, polyamides, fluoropolymers (such as polyvinyl fluoride PVF or poly(divinyl fluoride) PVDF) or polymethyl methacrylate (PMMA). Mention may also be made, as other support, of those made from metals or any type of photovoltaic cell.

These structures can be obtained from the composition described above by means of the conventional techniques of press molding, injection molding, blown film extrusion, extrusion-laminating, extrusion-coating, flat extrusion (also called extrusion-casting) or else sheet extrusion-calendering, it being possible for all these structures to be optionally thermoformed afterwards.

Generally, to form a solar module, a first lower layer of encapsulant, a photovoltaic cell, a second upper layer of encapsulant and then an upper protective layer are placed successively on a backsheet. There may also be additional layers, and in particular tie or adhesive layers. These various layers are assembled so as to form the module. It is specified that the photovoltaic modules according to the invention may consist of any photovoltaic structure comprising a layer of the composition described herein and are obviously not limited to those presented in this description.

In order to form the photovoltaic cell, it is possible to use any type of photovoltaic sensors, including "conventional" sensors based on monocrystalline or polycrystalline doped silicon; thin-film sensors formed, for example, from amorphous silicon, from cadmium telluride, from copper indium diselenide or organic materials may also be used.

As examples of a backsheet that can be used in the solar modules, mention may be made, non-exhaustively, of films based on a fluoropolymer (PVF or PVDF), such as, for example, multilayer fluoropolymer/polyethylene terephthalate/fluoropolymer or else fluoropolymer/polyethylene terephthalate/EVA films.

The protective sheet has abrasion resistance and impact strength properties, is transparent and protects the photovoltaic sensors from external moisture. In order to form this layer, mention may be made of glass, PMMA or any other polymer composition that combines these characteristics.

In order to assemble the various layers, it is possible to use any type of press-molding techniques such as, for example, hot pressing, vacuum pressing or lamination, in particular thermal lamination. The manufacturing conditions will be easily determined by those skilled in the art by adjusting the temperature and the pressure to the flow temperature of the composition.

In order to manufacture the solar modules according to the invention, those skilled in the art may refer, for example, to the *Handbook of Photovoltaic Science and Engineering*, Wiley, 2003.

The present invention will now be illustrated by means of particular exemplary embodiments described hereinafter. It is specified that these examples in no way limit the scope of the present invention.

Exemplary Embodiments

The following abbreviations will appear in the description of the examples:
BuA: butyl acrylate
MMA: methyl methacrylate
MEIO: 2-(2-oxoimidazolidinyl)ethyl methacrylate
EVA: ethylene-vinyl acetate copolymer
PI: polydispersity index
Mw: weight-average molecular mass
Mp: molecular mass at the distribution peak
Mn: number-average molecular mass.

The characterizations of the materials are carried out according to standard methods of analysis. The molecular masses are determined by means of size exclusion chromatography and are expressed in polystyrene equivalents. The monomer composition of the block copolymer is measured by nuclear magnetic resonance. In addition, the block copolymer content of the composition is measured by means of a technique known as liquid absorption chromatography.

Preparation of the Diblock

EXAMPLE 1

One poly(butyl acrylate)-poly(methyl methacrylate) (PBuA-PMMA) diblock copolymer was synthesized by controlled radical polymerization (CRP).

1) Synthesis of the PBuA First Block

The PBuA was synthesized in a 20 reactor in the absence of solvent using as initiator an alkoxyamine corresponding to formula (I) and known commercially as BlocBuilder®. The molecular mass Mn targeted is 25 000. The conversion rate targeted is 90%. The polymerization temperature is 115° C. The polymerization time is 115 minutes.

When the block copolymers require stripping of the PBuA in order to increase the glass transition of the PMMA second block, this stripping was carried out at a temperature of 80° C., for a period of 180 minutes, in the 20 l reactor.

2) Synthesis of the PMMA Second Block

The PMMA block was synthesized in the same 20 l reactor, from the PBuA synthesized during the first step, by adding MMA monomer and toluene. The polymerization time breaks down into 2 successive stages: 120 minutes at 105° C. and 120 minutes at 120° C.

Preparation of the Triblock

EXAMPLE 2

The poly(methyl methacrylate)-b-poly(butyl acrylate)-b-poly(methyl methacrylate) triblock copolymer was obtained by means of the controlled radical polymerization technique according to the same protocol as that described for the synthesis of the diblock copolymer, but by replacing the BlocBuilder with a difunctional alkoxyamine such as DIAMINS indicated below, and by introducing into the reactor, during the synthesis of the methacrylate blocks, a mixture containing 90% by weight of methyl methacrylate and 10% by weight of Norsocryl 104, which is a mixture containing 50% by weight of methyl methacrylate and 50% by weight of 2-(2-oxoimidazolidinyl)ethyl methacrylate (MEIO).

The product is recovered simply by drying the polymer according to a means known to those skilled in the art. During this step, the various additives necessary for the UV and thermal protection required for the photovoltaic-cell-encapsulating application are added.

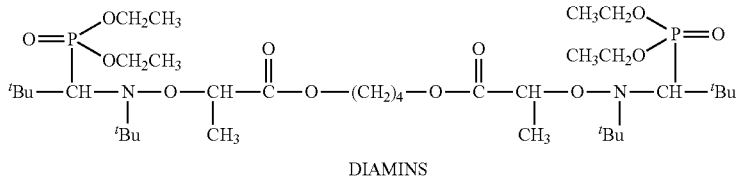

DIAMINS

The conditions for synthesis and the properties of the copolymers obtained are given in table I hereinafter.

TABLE I

| Copolymer sample reference | Example 1 | Example 2 |
|---|---|---|
| Reactor volume (1) | 20 | 20 |
| Monomer composition targeted (%): | | |
| BuA | 55 | 55 |
| MMA | 45 | 40 |
| MEIO | | 5 |
| Copolymer architecture | diblocks | triblocks |
| PBuA | non-stripped | stripped |
| Monomer composition by NMR (%): | | |
| BuA | 52 | 57 |
| MMA | 48 | 39 |

TABLE I-continued

| Copolymer sample reference | Example 1 | Example 2 |
|---|---|---|
| MEIO | | 4 |
| Mass PBuA: | | |
| Mp | 35 590 | 64 500 |
| Mn | 26 140 | 42 350 |
| Mw | 36 760 | 74 950 |
| PI | 1.41 | 1.77 |
| Mass copolymer: | | |
| Mn | 51 030 | 110 630 |
| Mp | 33 910 | 72 390 |
| Mw | 56 630 | 143 000 |

In order to show the advantageous properties of the compositions according to the invention and their advantageous use in solar modules, the following comparative compositions (CP) were also used:

CP1: ionomer-based composition.

CP2: composition based on an EVA copolymer comprising 33% by mass of vinyl acetate and having an MFI of 45 g/10 min (ASTM D 1238-190° C.-2.16 kg) and an organic peroxide.

The films are prepared with a Rheocord laboratory thermoplastic screw extruder, through a sheet die. The films then pass into a thermally regulated 3-roll calender and are then cooled in a waterbath.

Before extrusion, the samples are stored under vacuum at 80° C. for a minimum of 3 h.

Temperatures extruder zones 1, 2, 3: 175° C.
Temperatures die zone 4: 190° C.
Screw speed: 33 rpm
Distance between die and calender roll axis: on contact
Die gap: 0.1 mm
Film thickness: 400 μm The screw is purged 1 hopper before withdrawal or dismantled and cleaned.

The film of composition CP2 is crosslinked afterwards by heat treatment at 150° C. for 20 min under a press.

The films thus obtained were evaluated mechanically and optically according to the respective standards:
standard ASTM D882: determination of the tensile properties on films;
standard ASTM D1003: determination of the total luminous transmittance and of the haze.

An analysis using an atomic force microscope (Digital Instrument, Dimension 3100) made it possible to confirm the fact that the size of the domains of low Tg is indeed less than 100 nm.

The electrical volume resistivity was determined at 23° C. using a Novocontrol Concept 40 dielectric spectrometer. For each temperature, a frequency sweep was carried out between 0.1 Hz and $10^6$ Hz. The low-frequency (0.1 Hz) resistivity of the samples was recorded when this resistivity was independent of the frequency.

The creep resistance at 100° C. was determined on IFC (French Institute of Rubber) type test specimens cut from the films. The test consists in applying a stress of 0.5 MPa for 15 min at a given temperature and in measuring the residual elongation after return to ambient temperature.

The film of example 2 was pressed onto a glass plate having the dimensions 200(length)×50(width)×3(thickness) mm³ at 150° C. under 3 bar of pressure for 20 min. The adhesion was evaluated from a 90° peel test carried out at 100 nun/min on a Zwick 1445 tensile testing machine, according to standard ISO 8510-1. The width of the peeling arm was 15 mm. During the tests, only the peel strength between the glass support and the composition of example 2 is measured.

The results obtained are given in table II.

TABLE II

| | Module (Mpa) | Luminous transmittance (%) | Electrical volume resistivity ($\Omega \cdot m$) at 23° C. | Creep resistance (%) | Adhesion to glass (peel strength in N/15 mm) |
|---|---|---|---|---|---|
| Ex 1 | 240 | >94 | $10^{13}$ | >200 | not measured |
| Ex 2 | 60 | >94 | $10^{13}$ | 37 | 100 |
| CP 1 | 600 | 90 | $3 \times 10^{14}$ | >300 | not measured |
| CP 2 | 120 | 91 | $10^{13}$ | 10 | 110 |

These results show that:
the compositions according to the invention (Ex1 and Ex2) have a luminous transmittance which is very significantly greater than that of the ionomers (CP1), which is also a thermoplastic material, and than that of the crosslinked EVA (CP2), which will make it possible to obtain a greater solar module production yield;
the compositions according to the invention (Ex1 and Ex2) have the flexibility required for the manufacture of solar modules and the use thereof, and also a creep resistance at 100° C. which is greater than that of the ionomers (CP1), the test not having made it possible to measure the elongation since the ionomer creeps too much (>300%);
the resistivity of the samples according to the invention is similar to that observed for the crosslinked EVA-based comparative composition;
the adhesion to glass of a sample according to the invention is similar to that observed for the crosslinked EVA-based comparative composition.

The compositions according to the invention therefore meet the criteria for being able to be highly advantageously used as a tie or encapsulant in solar modules.

The invention claimed is:

1. A photovoltaic module comprising, as an encapsulant, a composition comprising a polyacrylate- or polymethacrylate-type block copolymer of formula B-(A)n, n being a natural integer greater than or equal to one, block A being a methacrylate having a Tg above 0° C., block B being a polyacrylate or a polymethacrylate having a Tg below 0° C., block B representing at least 50% by weight of the total weight of the block copolymer.

2. The photovoltaic module as claimed in claim 1, in which said block B contains butyl acrylate units and said block A contains methyl methacrylate units.

3. The photovoltaic module as claimed in claim 1, in which said block copolymer comprises a methacrylate monomer containing acid, anhydride or imidazolidone functions.

4. The photovoltaic module as claimed in claim 1, in which said composition also comprises at least one coupling agent.

5. The photovoltaic module as claimed in claim 1, in which said composition also comprises a tackifying resin, a plasticizer or another polymer, termed supplementary polymer, which is miscible or partially miscible with the acrylic block copolymer.

6. The photovoltaic module as claimed in claim 1, in which said composition also comprises at least one additional component that is crosslinking agents, UV absorbants, inorganic fillers, plasticizers, dyestuffs, optical brighteners or flame retardants.

7. The photovoltaic module as claimed in claim 1, in which said composition comprises at least 50% by mass of said acrylic block copolymer.

8. The photovoltaic module as claimed in claim 1, in which the block copolymer has a Young's modulus of less than 1000 MPa.

9. The photovoltaic module as claimed in claim 1, in which said composition also comprising the block copolymer is resistant to yellowing caused by UV radiation.

10. The photovoltaic module as claimed in claim 1, in which the flow temperature of the block copolymer is the glass transition temperature of the methacrylate block(s) and is between 80 and 150° C.

11. The photovoltaic module as claimed in claim 1, in which, for a film of said composition with a thickness of 400 μm and an electromagnetic wave with a wavelength ranging from 380 to 780 nm, the transmittance of said wave is greater than or equal to 90% and/or the haze is less than or equal to 5%, the transmittance and the haze of the film being measured according to standard ASTM D1003.

12. The photovoltaic module as claimed in claim 1, in which said composition comprises a PMMA-b-PBuA (poly(methyl methacrylate)-b-poly(butyl acrylate)) diblock copolymer, the monomer composition of which as determined by nuclear magnetic resonance is 52% BuA and 48% MMA.

13. The photovoltaic module as claimed in claim 1, in which said composition comprises a PMMA-b-PBuA-b-PMMA triblock copolymer, the monomer composition of which as determined by nuclear magnetic resonance is 57% BuA, 39% MMA and 4% MEIO.

14. The photovoltaic module as claimed in claim 1, in which said composition is applied to a support, in the form of a layer of which the thickness is from 5 μm to 2 mm.

15. The photovoltaic module as claimed in claim 14, in which said support consists of glass, polymer, metal or any type of photovoltaic sensor.

16. The photovoltaic module as claimed in claim 1, wherein n is 1-8.

17. The photovoltaic module as claimed in claim 1, in which the block copolymer has a Young's modulus of 1 to 700 MPa.

18. The photovoltaic module as claimed in claim 1, in which the block copolymer has a Young's modulus of 10 to 500 MPa.

19. The photovoltaic module as claimed in claim 1, in which the support is PMMA.

* * * * *